US007906372B2

(12) United States Patent
Meadowcroft

(10) Patent No.: US 7,906,372 B2
(45) Date of Patent: Mar. 15, 2011

(54) LENS SUPPORT AND WIREBOND PROTECTOR

(75) Inventor: David J. K. Meadowcroft, San Jose, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 192 days.

(21) Appl. No.: 12/169,784

(22) Filed: Jul. 9, 2008

(65) Prior Publication Data

US 2010/0007034 A1     Jan. 14, 2010

(51) Int. Cl.
*H01L 21/00* (2006.01)
(52) U.S. Cl. .......... 438/116; 438/125; 257/680; 257/731
(58) Field of Classification Search ............ 438/116
See application file for complete search history.

(56) References Cited

U.S. PATENT DOCUMENTS

| 4,696,526 A * | 9/1987 | Newton et al. ............ 439/68 |
| 4,760,440 A | 7/1988 | Bigler |
| 4,987,477 A | 1/1991 | Ikeno |
| 5,065,279 A | 11/1991 | Lazenby et al. |
| 5,436,492 A * | 7/1995 | Yamanaka ............ 257/433 |
| 5,579,212 A * | 11/1996 | Albano et al. ............ 361/820 |
| 5,637,923 A * | 6/1997 | Kasai et al. ............ 257/730 |
| 5,907,189 A * | 5/1999 | Mertol ............ 257/787 |
| 5,936,850 A * | 8/1999 | Takahashi et al. ............ 361/784 |
| 5,956,576 A | 9/1999 | Toy et al. |
| 6,037,655 A | 3/2000 | Philbrick |
| 6,225,689 B1 * | 5/2001 | Moden et al. ............ 257/686 |
| 6,261,868 B1 | 7/2001 | Miller |
| 6,630,371 B2 * | 10/2003 | Hembree ............ 438/118 |
| 7,701,723 B2 | 4/2010 | Peng et al. |
| 2006/0262820 A1 | 11/2006 | Itoh et al. |
| 2009/0121338 A1 * | 5/2009 | Seng ............ 257/686 |

FOREIGN PATENT DOCUMENTS

| EP | 1333489 | 8/2003 |
| EP | 1347323 | 9/2003 |

* cited by examiner

*Primary Examiner* — Jarrett J Stark
*Assistant Examiner* — Nicholas Tobergte

(57) ABSTRACT

A wirebond protector has an elongated shape that corresponds to the elongated array of wirebonds along the edge of a microelectronic device that connect a semiconductor die to electrical conductors on a substrate. In making the microelectronic device with wirebond protection, wirebonds are first formed in the conventional manner The wirebond protector is then attached to the device in an orientation in which it extends along the array of wirebonds to at least partially cover the wirebonds.

6 Claims, 8 Drawing Sheets

LENS SUPPORT AND WIREBOND PROTECTOR

BACKGROUND

In optical communications networks, optical transmitter modules, optical receiver modules, and optical transceiver modules are used to transmit and receive optical signals over optical fibers. In a transmit portion of such an optical module, a laser generates modulated optical signals that represent data, which are then transmitted over an optical fiber. The laser can be, for example, a Vertical Cavity Surface Emitting Laser (VCSEL) or an edge-emitting laser. In a receive portion of such a module, an optics system directs light propagating out of the end of an optical fiber onto an optical detector or photodetector, which converts the optical energy into electrical energy. An photodetector is typically a semiconductor photodiode device, such as a PIN (p-type/intrinsic/n-type) photodiode. Optical transceiver modules typically include multiple lasers for transmitting multiple data signals and multiple photodiodes for receiving multiple data signals.

An optical module is commonly assembled by mounting the optical device, i.e., laser or optical detector, on a substrate, also referred to as a leadframe. As the optical device typically comprises a microelectronic semiconductor die, electrical connections between the die and conductors on the substrate are made by a technique known as wirebonding. Wirebonding is a technique in which one end of a very fine wire is bonded to a pad on the die using thermal or ultrasonic energy, and the other end is bonded to one of the conductors on the substrate. A lens assembly can be aligned with the transmit or receive optical ports of the die and mounted in fixed relation to the die and substrate.

Wirebonds are extremely fragile because the wires are extremely fine, i.e., thin gauge. Rough handling of the optical assembly can easily break or dislodge a wirebond. In some optical assemblies, the wirebonds are protected by an enclosure or module body that encloses the entire optical assembly. In some assemblies, the wirebonds are encapsulated in a dielectric resin to protect them.

SUMMARY

Embodiments of the present invention relate to a wirebond protector, microelectronic device, and method for protecting wirebonds. The wirebond protector has an elongated shape that corresponds to the elongated array of wirebonds along the edge of a microelectronic device that connect a semiconductor die to electrical connections on a substrate. In making the microelectronic device, the wirebonds are first formed in the conventional manner. The wirebond protector is then attached to the microelectronic device in an orientation in which it extends along the array of wirebonds to at least partially cover and thereby protect the wirebonds.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
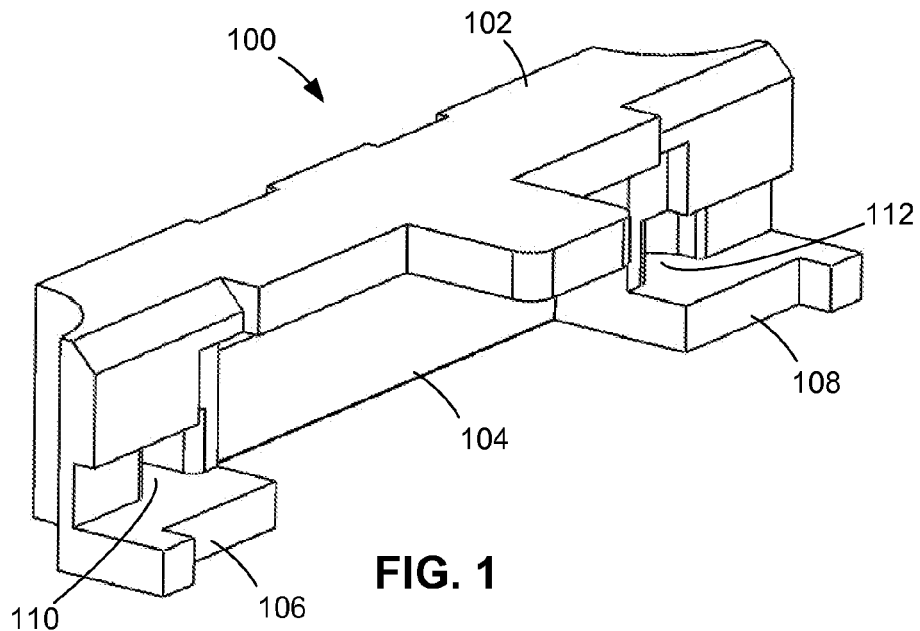
FIG. 1 is a perspective view of a wirebond protector, in accordance with an exemplary embodiment of the invention.
Figure 2:
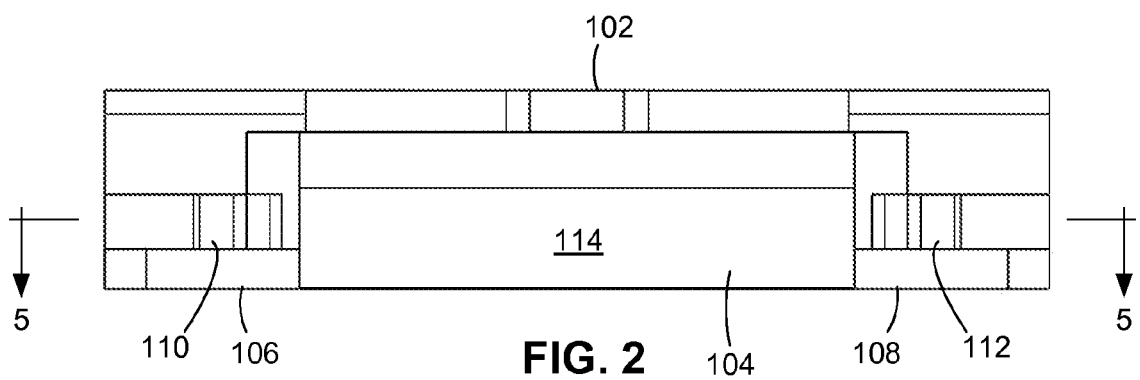
FIG. 2 is a side elevation view of the wirebond protector of FIG. 1.
Figure 3:
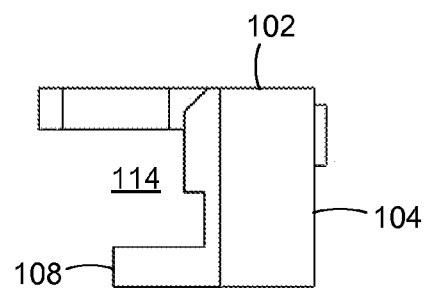
FIG. 3 is an end view of the wirebond protector of FIGS. 1-2.
Figure 4:
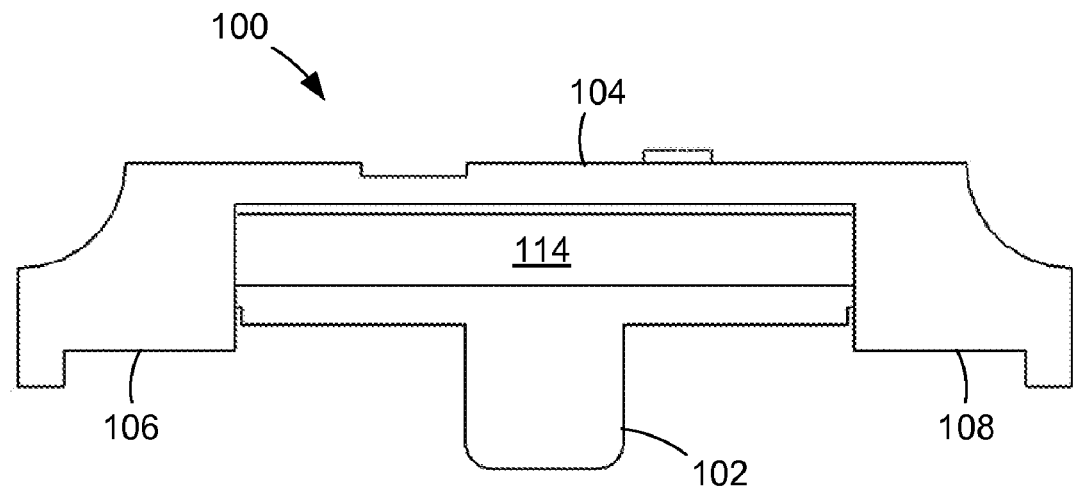
FIG. 4 is bottom view of the wirebond protector of FIGS. 1-3.
Figure 5:
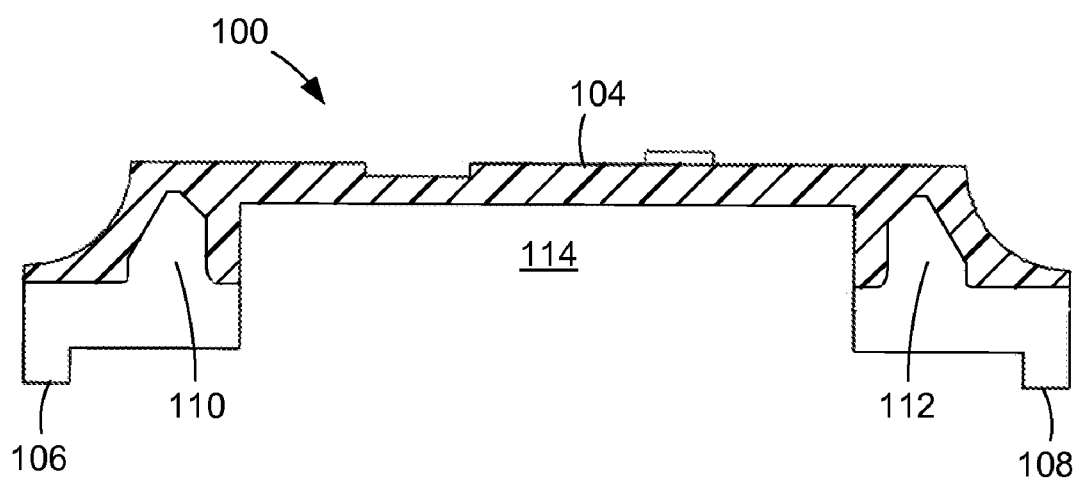
FIG. 5 is a sectional view of the wirebond protector, taken on line 5-5 of FIG. 2.

As illustrated in FIGS. 1-5, in an exemplary embodiment, a wirebond protector 100 has an elongated shape defined by a top wall 102 and a side wall 104. At opposing ends of wirebond protector 100 are feet 106 and 108 that together define a bottom of wirebond protector 100. Recesses 110 and 112 at the respective ends of wirebond protector 100 facilitate aligning and attaching wirebond protector 100, as described below. It should be noted that the intersection of top wall 102 and side wall 104 defines an interior space or cavity 114 in wirebond protector 100.

Wirebond protector 100 can be made from any suitable material, including plastic, epoxy or other resin, metal, etc. Wirebond protector 100 can be formed by injection molding, casting, extrusion, or any other suitable conventional processes. Wirebond protector 100 can be, for example, injection molded from a transparent, semi-transparent, or opaque liquid crystal polymer (LCP).

Figure 6:
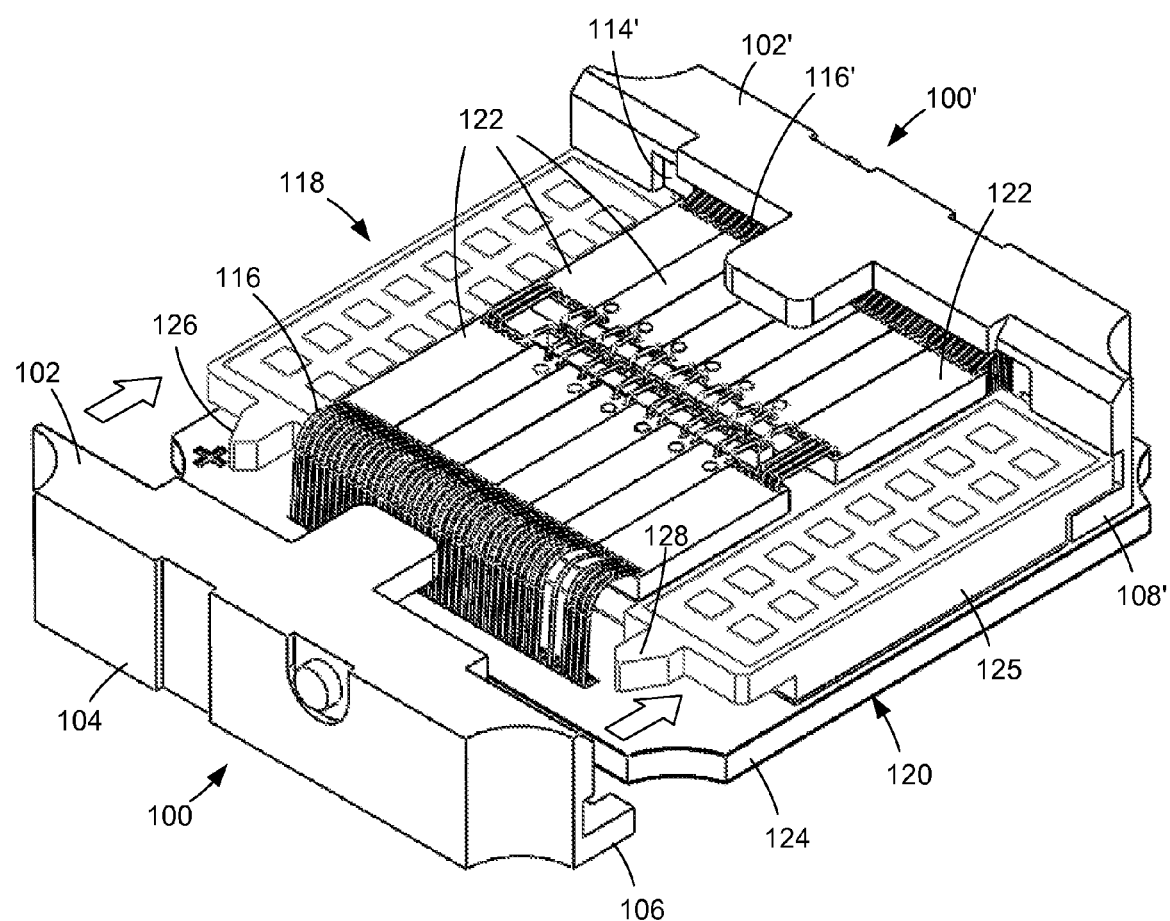
FIG. 6 illustrates attaching the wirebond protector of FIGS. 1-5 to the remainder of a microelectronic device to protect the wirebonds.
Figure 7:
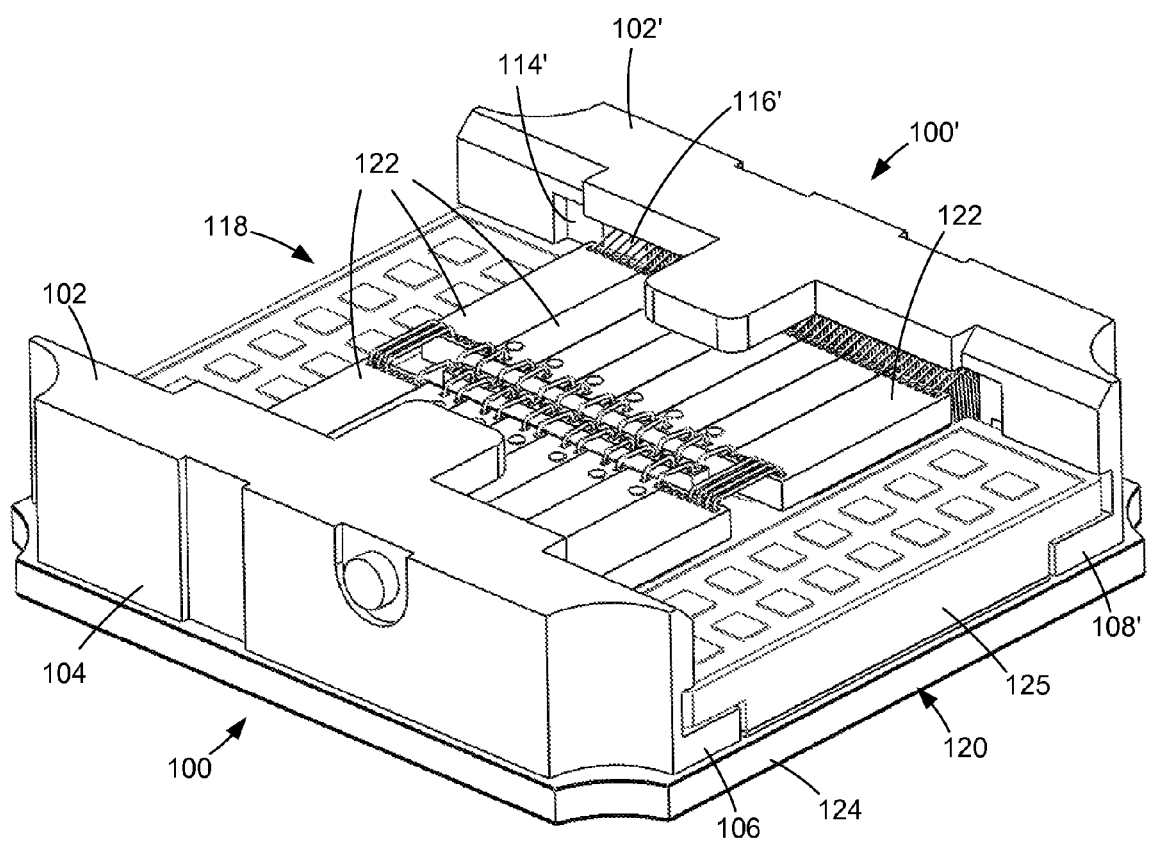
FIG. 7 is a perspective view of a microelectronic device that includes the wirebond protector of FIGS. 1-5.
Figure 8:
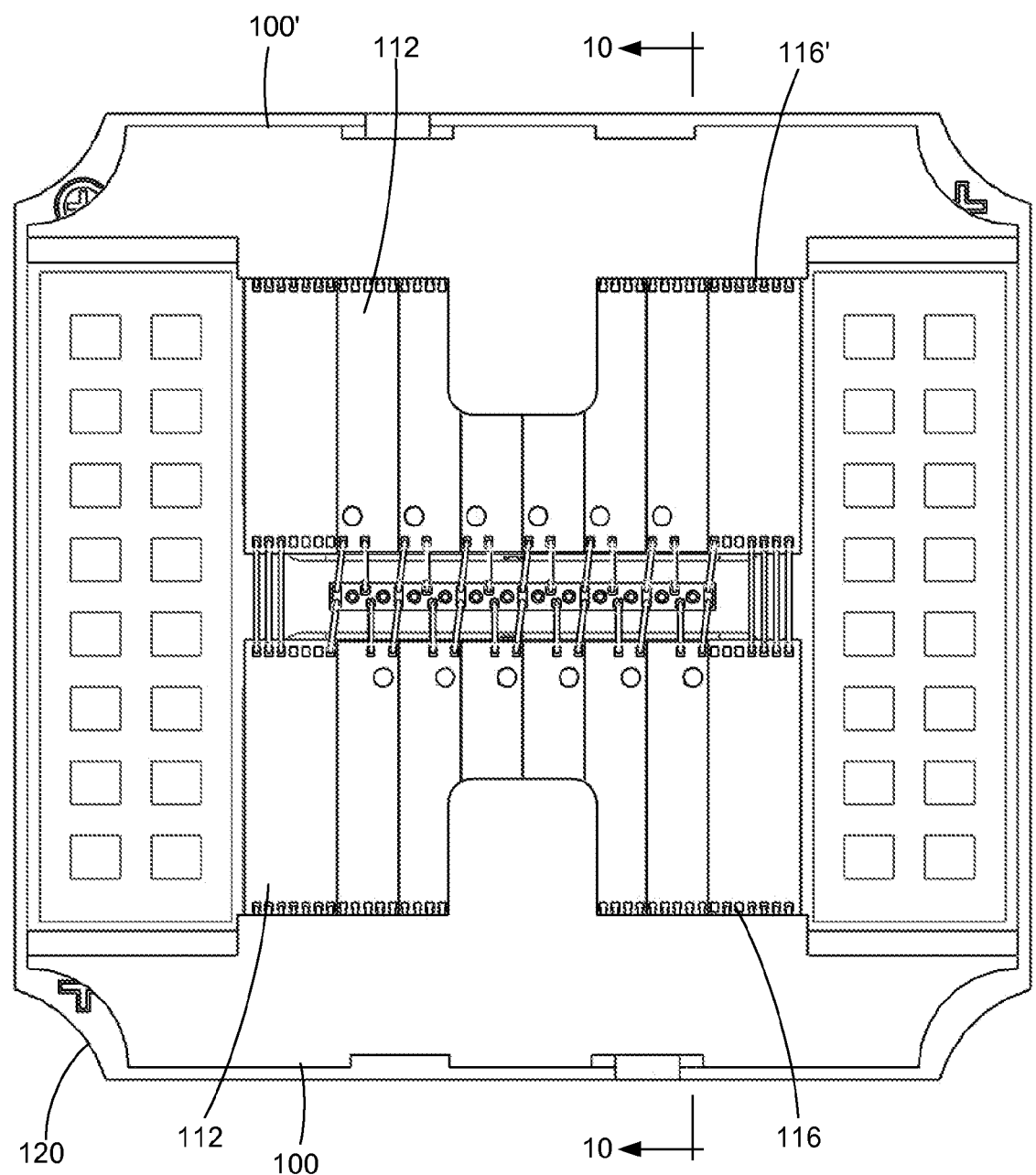
FIG. 8 is a top view of the microelectronic device of FIG. 7.
Figure 9:
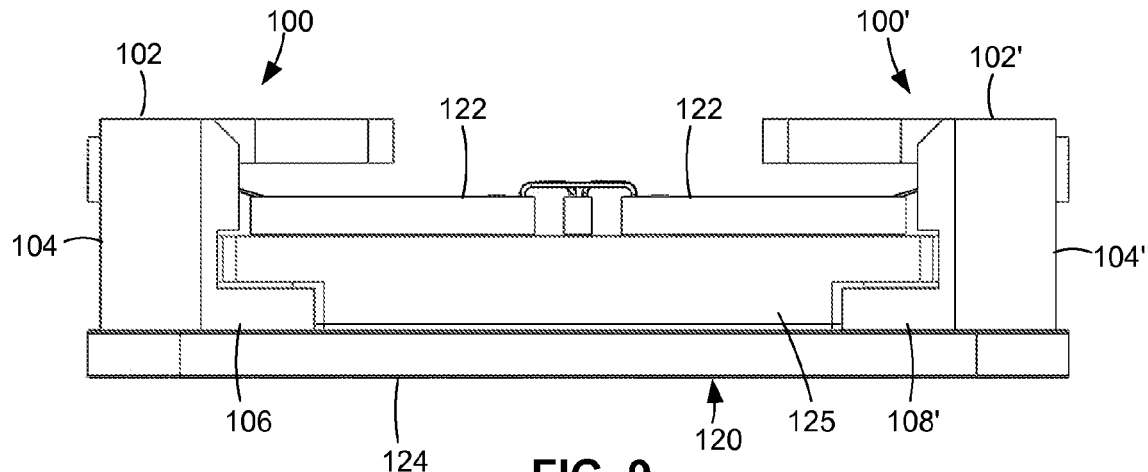
FIG. 9 is a side elevation view of the microelectronic device of FIG. 7.
Figure 10:
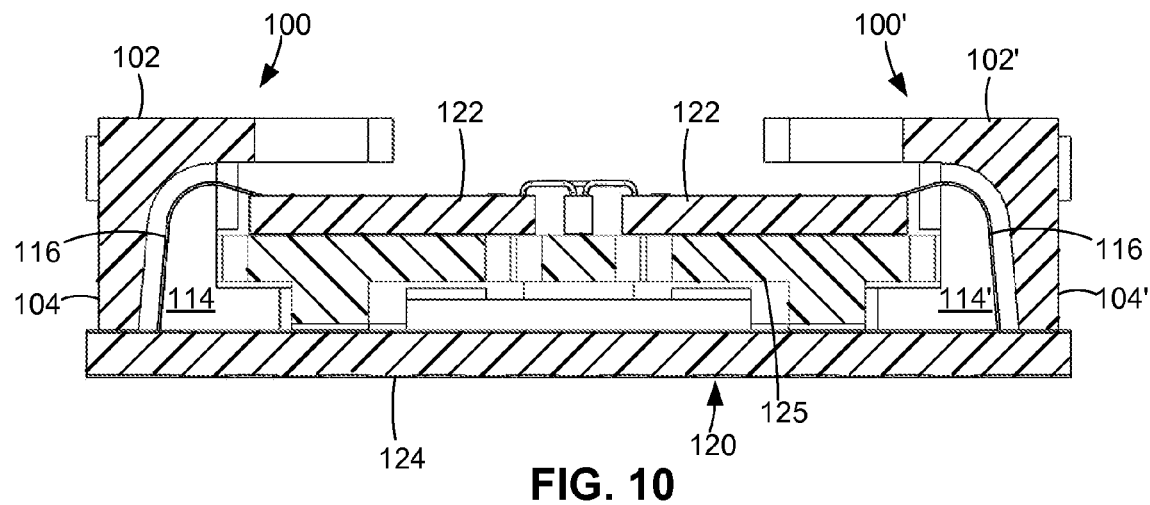
FIG. 10 is sectional of the microelectronic device of FIG. 7, taken on line 10-10 of FIG. 8.

As illustrated in FIG. 6, a wirebond array 116 of a microelectronic device assembly 118 can be protected by attaching wirebond protector 100. Wirebond array 116 comprises multiple wirebonds that extend along an edge of a substrate 120. As well understood in the art (and thus not shown in detail for purposes of clarity), each wirebond comprises a fine wire having one end bonded to a pad of a semiconductor die 122 and another end bonded to a conductor of the substrate 120. Wirebond array 116 is defined by the line of wirebonds, which is commonly straight or linear, as in the illustrated embodiment of the invention, but can alternatively have one or more bends. Note that the elongated shape of wirebond protector 100 corresponds to or conforms to the elongated shape of wirebond array 116. Accordingly, in embodiments in which a wirebond array having a non-linear shape is to be protected, the wirebond protector would have a corresponding or conforming shape. For example, in an alternative embodiment (not shown) the wirebond protector could be L-shaped to protect an L-shaped wirebond array.

In the exemplary embodiment, substrate 120 comprises a leadframe 124 and a mounting core 125 attached to the upper surface of leadframe 124. Although the terms "substrate" and "leadframe" are sometimes used interchangeably in the art, the term "substrate" as used in this patent specification ("herein") is not limited to a leadframe; rather, the term "substrate" broadly includes within its scope of meaning any suitable element or assembly of elements. In the exemplary embodiment, several semiconductor dies 122 are mounted on substrate 120 by virtue of being mounted on mounting core 125, which in turn is mounted on leadframe 124 of substrate 120. Although in the exemplary embodiment substrate 120 comprises leadframe 124 and mounting core 125, in other embodiments the substrate can have any other suitable structure.

Semiconductor dies 122 can comprise any suitable type of device known in the art. For example, they can be optical transmitters (e.g., VCSELs) and receivers (e.g., photodiodes) in an embodiment in which microelectronic device assembly 118 is part of an optical transceiver module. Although the exemplary embodiment includes multiple semiconductor dies 122, some of which are optical transmitters and others of which are optical receivers, other embodiments can have as few as a single die.

Wirebond protector 100 can be attached to microelectronic device assembly 118 by moving it generally in the direction of the arrows shown in FIG. 6 into alignment with microelectronic device assembly 118. As wirebond protector 100 approaches microelectronic device assembly 118, tapered or angled surfaces in recesses 110 and 112 guide corresponding protrusions 126 and 128 on (mounting core 125 of) substrate 120. Protrusions 126 and 128 mate with recesses 110 and 112 (see FIGS. 1, 2 and 5) in a snap engagement or, alternatively, a press-fit (also known as an interference-fit) engagement. This guiding action inhibits portions of wirebond protector 100 from colliding with a wirebond and damaging it as wirebond protector 100 is moved into alignment. When wirebond protector 100 is fully mated with microelectronic device assembly 118, feet 106 and 108 rest on the surface of (leadframe 124 of) substrate 120 to stabilize the structure against undesired movement. Protruding portions of feet 106 and 108 also serve as stops, abutting portions of substrate 120 when wirebond protector 100 is fully mated with microelectronic device assembly 118.

In some embodiments, a suitable adhesive can be used alternatively or in addition to the mechanical mating features described above to secure wirebond protector 100 to microelectronic device assembly 118. Note that although in the exemplary embodiment wirebond protector 100 attaches to mounting core 125, in other embodiments the wirebond protector can attach to any other element or portion of the substrate.

In the exemplary embodiment, two such wirebond protectors 100 and 100' are attached to opposing edges of substrate 120 to protect correspondingly opposing wirebond arrays 116 and 116', as shown in FIGS. 6-10. Note that the individual wirebonds of arrays 116 and 116' are covered by or semi-enclosed within cavities 114 and 114', respectively. Although in the exemplary embodiment wirebond protectors 100 and 100' nearly completely shield or protect wirebond arrays 116 and 116', in other embodiments it is suitable that the wirebond protector at least partially cover the wirebonds.

It can be seen in FIGS. 6-10 that microelectronic device assembly 118 with attached wirebond protectors 100 and 100' protects the wirebonds against adverse effects of rough handling. It should be noted that wirebond protectors 100 and 100' also serve to shield semiconductor dies 122 and other elements from contaminants such as dirt and dust particles.

Figure 11:
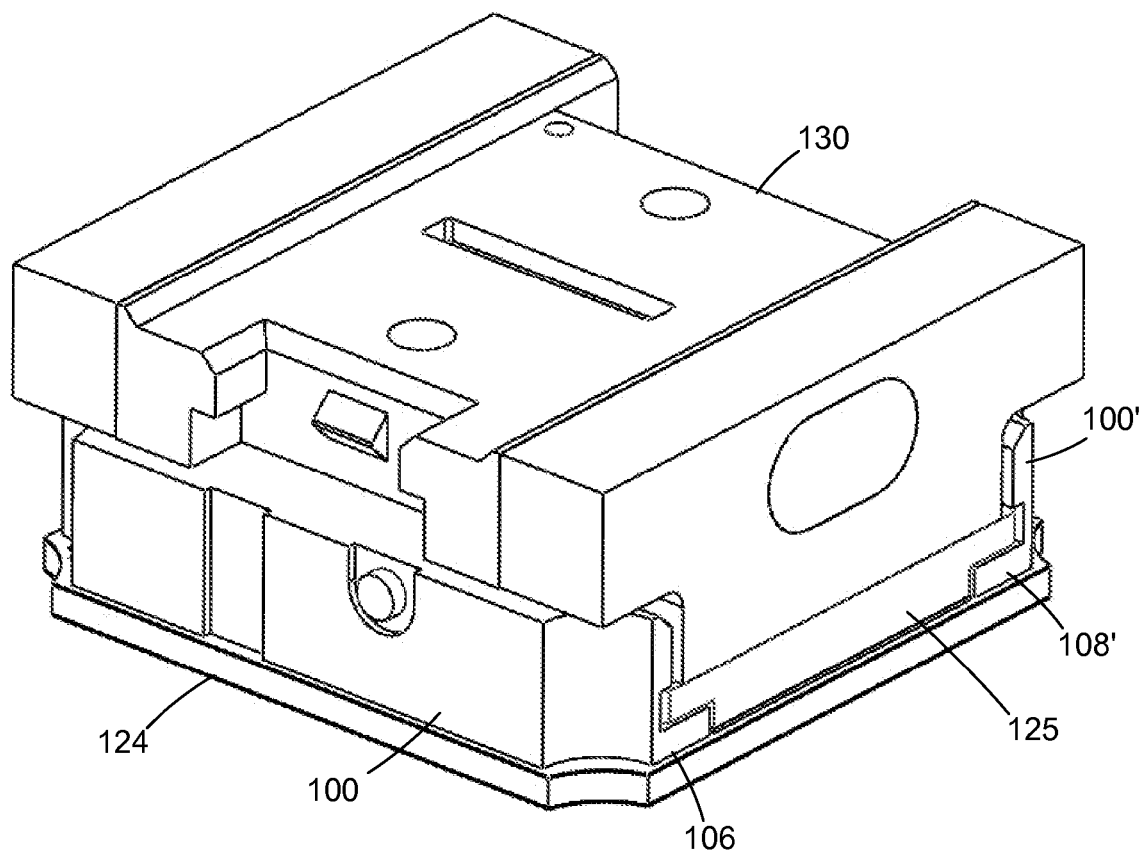
FIG. 11 is a perspective view similar to FIG. 7, with an additional device mounted on top of the wirebond protectors.

In addition to wirebond protector 100 protecting the wirebonds against damage and shielding the wirebonds and other areas against contaminants, the flat surface of top wall 102 of wirebond protector 100 can be used as a mounting or receiving surface for an additional or auxiliary device. As illustrated in FIG. 11, in the exemplary embodiment, in which microelectronic device assembly 118 is part of an optical transceiver module, such an additional device can be a lens assembly 130. As known in the art, optical lenses are commonly included in optical transceiver modules to focus light produced by an optical transmitter such as a VCSEL or focus received light upon an optical detector.

As described above, for example, some or all of dies 122 can be VCSELs. Lens assembly 130 can be mounted with its opposing edges on the flat surfaces of upper walls 102 and 102' of respective wirebond protectors 100 and 100', with the body of lens assembly 130 spanning the interior portion of microelectronic device assembly 118. Supporting lens assembly 130 on wirebond protectors 100 and 100' facilitates optically aligning the lenses (not shown) of lens assembly 130 with the VCSEL ports (not shown). Epoxy or other suitable adhesive applied to the flat surfaces of top walls 102 and 102' can be used to secure lens assembly 130 to wirebond protectors 100 and 100'. As the epoxy is disposed in a plane perpendicular or normal to the optical axes of the VCSEL ports, forces resulting from the curing of the epoxy are not in directions that would tend to pull the lenses of lens assembly 118 out of optical alignment with the VCSEL ports. Also note that with lens assembly 130 covering the interior of microelectronic device assembly 118, the combination of wirebond protectors 100 and 100' and lens assembly 130 further serves to seal the interior against contaminants, especially if epoxy or other sealant is used.

It should further be noted that in embodiments in which wirebond protectors 100 and 100' are transparent or at least semi-transparent, manufacturing personnel can visually inspect the wirebonds even after wirebond protectors 100 and 100' have been attached to microelectronic device assembly 118, and even after lens assembly 130 or other such auxiliary device has been attached.

Figure 12:
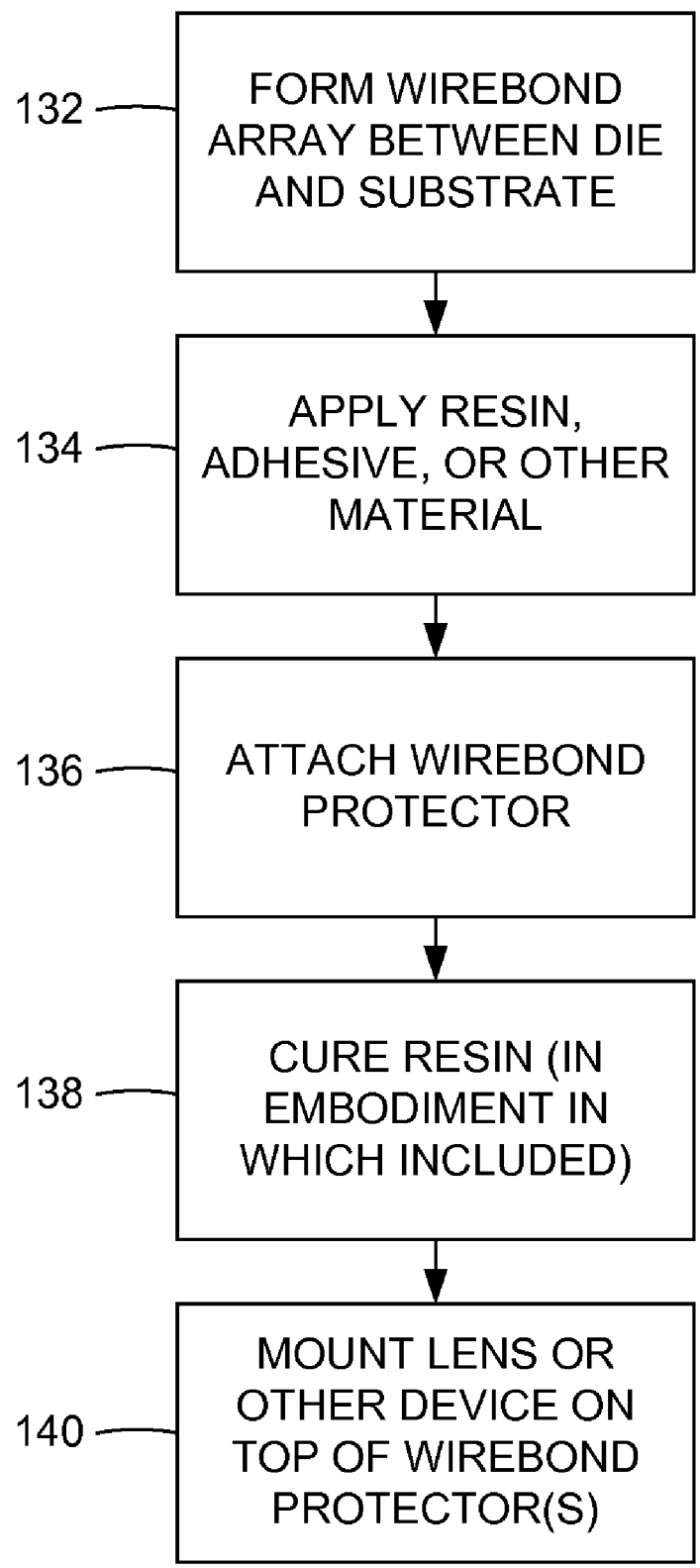
FIG. 12 is a flow diagram, illustrating an exemplary method of making a microelectronic device having wirebond protectors.

Wirebonds of a microelectronic device can be protected in accordance with the invention by, for example, performing the method illustrated in FIG. 12. As indicated by step 132, a wirebond array 116 is first formed between semiconductor die 122 and substrate 120. As well understood in the art, wirebonding entails bonding one end of a very fine wire to a pad (not shown) on die 122 using thermal or ultrasonic energy, and bonding the other end of the wire to one of the conductors (not shown) of substrate 120.

Various additional steps can be included in some embodiments of the method. For example, as indicated by step 134, a resin, adhesive or other material can be applied to a portion of wirebond protector 100 or to a mating element of semiconductor device assembly 118. The material can be used to adhere wirebond protector 100 to the mating portion of semiconductor device assembly 118, to encapsulate the wirebonds, or for other suitable purposes. For example, the material can be applied to the interior or cavity 114 to encapsulate the wirebonds or to the surface of top wall 102 to adhere lens assembly 130.

As indicated by step 136, wirebond protector 100 is then attached in an orientation that at least partially covers wirebond array 116. Two or more such wirebond protectors can be attached in embodiments in which two or more corresponding wirebond arrays are to be protected. As best illustrated in FIGS. 6-10, the wirebonds of arrays 116 and 116' are thereby enclosed within cavities 114 and 114', respectively.

As indicated by step 138, in embodiments in which an adhesive or other material is applied, the material can be cured to harden or set it. In embodiments in which wirebond protector 100 is transparent or otherwise transmissive of ultraviolet (UV) light, the material can be a UV light-curable resin or epoxy. Note that the wirebonds can be visually inspected in an embodiment in which both the epoxy and wirebond protector 100 are sufficiently transparent or clear.

As indicated by step 140, in some embodiments an auxiliary device can be mounted on one or more wirebond protectors 100. As described above, in the exemplary embodiment lens assembly 130 is mounted between two wirebond protectors 100 and 100'. Although in the exemplary embodiment this auxiliary device is a lens assembly, in other embodiments it can be any other suitable type of device.

Any suitable conventional steps can also be included, such as mounting the entire assembly in a suitable transceiver module package or enclosure. Also, it should be recognized that not all embodiments need include all of the above-described steps. For example, some embodiments do not include some or all of steps 134, 138 and 140. Furthermore, steps can be performed in any suitable order unless explicitly stated otherwise.

One or more illustrative embodiments of the invention have been described above. However, it is to be understood that the invention is defined by the appended claims and is not limited to the specific embodiments described.

What is claimed is:

1. A method for protecting wirebonds of a microelectronic device, comprising:
    wirebonding pads of an opto-electronic semiconductor die to electrical connections of a portion of a substrate on which the die is mounted to form a plurality of elongated wirebond arrays, a first wirebond array of the plurality of elongated wirebond arrays extending along a first edge of the opto-electronic semiconductor die, a second wirebond array of the plurality of elongated arrays of wirebonds extending along a second edge of the opto-electronic semiconductor die;
    attaching a first elongated wirebond protector to the microelectronic device along the first wirebond array to at least partially cover the wirebonds of the first wirebond array and not cover the opto-electronic semiconductor die;
    attaching a second elongated wirebond protector to the microelectronic device along the second wirebond array to at least partially cover the wirebonds of the second wirebond array and not cover the opto-electronic semiconductor die; and
    mounting an optical device on respective receiving surfaces of the first and second elongated wirebond protectors in an orientation with the optical device extending across the substrate from one wirebond protector to another, wherein a first end of the optical device is supported by the first elongated wirebond protector, a second end of the optical device is supported by the second eleongated wirebond protector, and a lower surface of the optical device between the first and second ends of the device is immediately adjacent an upper surface of the opto-electronic semiconductor die where the opto-electronic semiconductor die is not covered by the first and second elongated wirebond protectors, a region between the lower surface of the optical device and the upper surface of the opto-electronic semiconductor die providing an optical signal path between the optical device and the opto-electronic semiconductor die.

2. The method claimed in claim 1, wherein attaching the first elongated wirebond protector comprises engaging a feature of the first elongated wirebond protector to a mating feature of the substrate, and attaching the second elongated wirebond protector comprises engaging a feature of the second elongated wirebond protector to a mating feature of the substrate.

3. The method claimed in claim 2, wherein engaging a feature of the first elongated wirebond protector comprises snapping the feature of the first elongated wirebond protector to the mating feature of the substrate, and engaging a feature of the second elongated wirebond protector comprises snapping the feature of the second elongated wirebond protector to the mating feature of the substrate.

4. The method claimed in claim 1, further comprising providing adhesive in a channel of the wirebond protector.

5. The method claimed in claim 4, further comprising impinging light upon a light-transmissive outer surface of the wirebond protector to optically cure adhesive in the channel.

6. The method claimed in claim 1, further comprising visually inspecting the wirebonds through a clear wall of the wirebond protector.

* * * * *